(12) United States Patent
Lee et al.

(10) Patent No.: US 10,268,788 B2
(45) Date of Patent: Apr. 23, 2019

(54) METHOD AND SYSTEM FOR FREQUENCY-AWARE INPUT/OUTPUT SIGNAL INTEGRITY ANALYSIS

(71) Applicant: TAIWAN SEMICONDUCTOR MANUFACTURING COMPANY LTD., Hsinchu (TW)

(72) Inventors: Hui-Yu Lee, Hsin-Chu (TW); Hao-Tien Kan, Hsin-Bei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 62 days.

(21) Appl. No.: 15/599,884

(22) Filed: May 19, 2017

(65) Prior Publication Data

US 2018/0336305 A1 Nov. 22, 2018

(51) Int. Cl.
 *G06F 17/50* (2006.01)
(52) U.S. Cl.
 CPC .................. *G06F 17/5036* (2013.01)
(58) Field of Classification Search
 CPC ................................. G06F 17/5036
 See application file for complete search history.

(56) References Cited

U.S. PATENT DOCUMENTS

| 6,594,604 | B2* | 7/2003 | Metzger | G01R 31/2822 |
| | | | | 702/104 |
| 8,386,216 | B1* | 2/2013 | Al-Hawari | G06F 17/5036 |
| | | | | 703/2 |
| 9,324,389 | B2* | 4/2016 | Tam | G11C 7/1006 |
| 9,798,848 | B1* | 10/2017 | Keshavan | G06F 17/5081 |
| 9,846,189 | B2* | 12/2017 | Mellitz | G01R 27/32 |

OTHER PUBLICATIONS

Reso, Mike et al., "Signal Integrity Charaqcterization techniques" Agillent Technologies, 2009, pp. 1-783.*

* cited by examiner

*Primary Examiner* — Stacy Whitmore
(74) *Attorney, Agent, or Firm* — WPAT, P.C., Intellectual Property Attorneys; Anthony King

(57) ABSTRACT

A method includes building a driver model in frequency domain, extracting S (scattering) parameters, the S parameters to describe a real curve that represents a real signal channel between the driver model and a load circuit, and generating, based on the extracted S parameters, an approaching curve of the real curve, the approaching curve being expressed in an approaching equation.

20 Claims, 9 Drawing Sheets

$$S_{ij}(\omega) = \alpha_{ij} + \beta_{ij}\omega + \gamma_{ij}\omega^2$$

$$\underbrace{\begin{bmatrix} G_1 & -G_1 & 0 & 0 & 0 & 0 & 0 \\ -G_1 & G_1 & 0 & 0 & -G_2 & 0 & 0 & 0 \\ 0 & 0 & Y_{01} & 0 & 0 & -Y_{02} \\ 0 & 0 & -S_{11(\omega)} & 1 & -S_{12(\omega)} & 0 \\ 0 & 0 & -S_{21(\omega)} & 0 & -S_{22(\omega)} & 1 \\ 1 & 0 & -1 & 0 & 0 & 0 \\ 0 & 1 & 0 & -1 & 0 & 0 & 1 \end{bmatrix}}_{G(\omega)} \underbrace{\begin{bmatrix} V_1 \\ V_{p1} \\ V_{p2} \\ a_1 \\ b_1 \\ a_2 \\ b_2 \end{bmatrix}}_{V} = \underbrace{\begin{bmatrix} -i_{vs} \\ 0 \\ 0 \\ 0 \\ 0 \\ 0 \\ 0 \end{bmatrix}}_{I}$$

FIG. 6

$$G(\omega) = \begin{bmatrix} G_1 & -G_1 & 0 & 0 & 0 & 0 & 0 & 0 \\ -G_1 & G_1 & 0 & 0 & 0 & 1 & 0 & 0 \\ 0 & 0 & -G_2 & 0 & 0 & 0 & 1 & 0 \\ 0 & 0 & 0 & Y_{01} & -Y_{01} & 0 & 1 & 0 & -Y_{02} \\ 0 & 0 & 0 & -s_{11(\omega)} & -s_{12(\omega)} & 0 & 0 & 0 \\ 0 & 0 & 0 & -s_{21(\omega)} & -s_{22(\omega)} & 0 & 0 & 0 \\ 0 & 0 & 0 & -1 & 0 & 1 & 0 & 0 \\ 0 & 0 & 0 & 0 & -1 & 0 & 1 & 1 \end{bmatrix}$$

$$= \underbrace{\begin{bmatrix} G_1 & -G_1 & 0 & 0 & 0 & 0 & 0 & 0 \\ -G_1 & G_1 & 0 & 0 & 0 & 1 & 0 & 0 \\ 0 & 0 & -G_2 & 0 & 0 & 0 & 1 & 0 \\ 0 & 0 & 0 & Y_{01} & -Y_{01} & 0 & 0 & -Y_{02} \\ 0 & 0 & 0 & -\alpha_{11} & -\alpha_{12} & 0 & 0 & 0 \\ 0 & 0 & 0 & -\alpha_{21} & -\alpha_{22} & 0 & 0 & 0 \\ 0 & 0 & 0 & -1 & 0 & 1 & 0 & 1 \\ 0 & 0 & 0 & 0 & -1 & 0 & 1 & 1 \end{bmatrix}}_{G_0} + \underbrace{\begin{bmatrix} 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & -\beta_{11}\omega & -\beta_{12}\omega & 0 & 0 & 0 \\ 0 & 0 & 0 & -\beta_{21}\omega & -\beta_{22}\omega & 0 & 0 & 0 \\ 0 & 0 & 0 & 0 & 0 & 0 & 0 & 0 \\ 0 & 0 & 0 & 0 & 0 & 0 & 0 & 0 \end{bmatrix}}_{G_1} + \underbrace{\begin{bmatrix} 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & -\gamma_{11}\omega^2 & -\gamma_{12}\omega^2 & 0 & 0 & 0 \\ 0 & 0 & 0 & -\gamma_{21}\omega^2 & -\gamma_{22}\omega^2 & 0 & 0 & 0 \\ 0 & 0 & 0 & 0 & 0 & 0 & 0 & 0 \\ 0 & 0 & 0 & 0 & 0 & 0 & 0 & 0 \end{bmatrix}}_{G_2}$$

FIG. 7

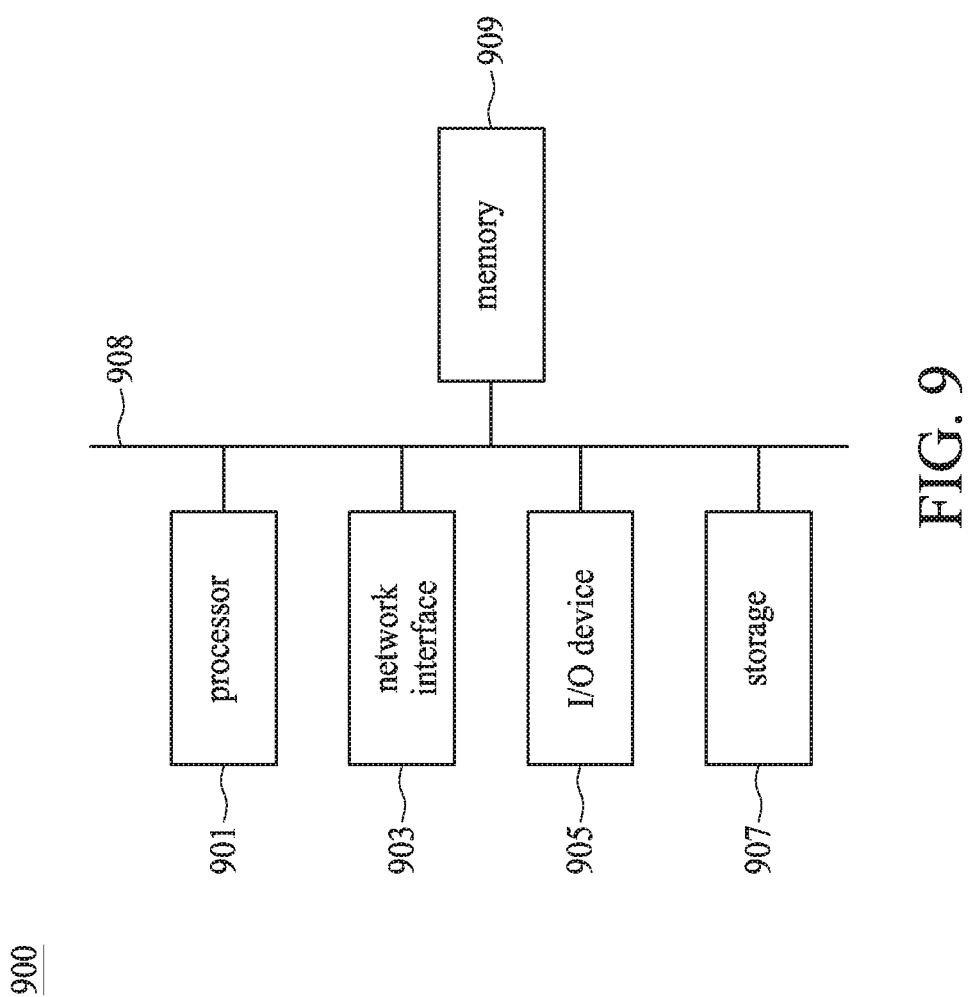

METHOD AND SYSTEM FOR FREQUENCY-AWARE INPUT/OUTPUT SIGNAL INTEGRITY ANALYSIS

BACKGROUND

With the continuing upscaling speed of input/output (I/O) interfaces, signal-integrity (SI) performance is as important to specify as digital functionality or clock speed for high-speed boards and integrated circuits (ICs). Signal integrity refers to the quality of a signal being at the correct level, within a certain time interval at a given node of a system. During transmission of a signal from a near-end node to a far-end node, if by the time an output signal read at the far-end node has not reached a desired voltage value, the transmission results in an incorrect reading. Comprehensive analysis and measurement covering high volume manufacturing is desired to ensure the boards or ICs can meet industry electrical performance requirements and operate without failure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a diagram showing a frequency-aware matrix created using S-parameter-based equations of approaching curves.

FIG. 7 is a diagram showing separation of a G matrix in FIG. 6 in different powers of angular frequency.

FIG. 9 is a block diagram of a system for timing optimization, in accordance with some embodiments.

DETAILED DESCRIPTION

Figure 1:
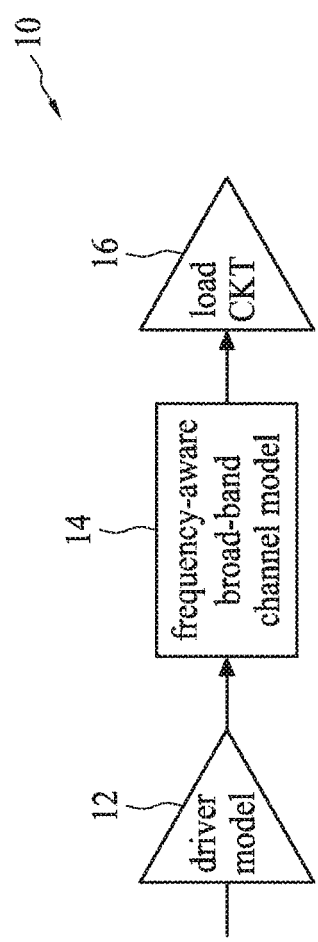
FIG. 1 is a block diagram of a system for analysis of signal integrity, accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram of a system 10 for analysis of signal integrity, in accordance with some embodiments.

Referring to HG. 1, the system 10 includes a driver model 12, a channel model 14 and a load circuit 16. The driver model 12 represents the behavior of an input/output (I/O) driver, which sends a signal pattern via the channel model 14 towards the load circuit 16. The driver model 12, such as an I/O driver of a controller, is connected between a power/ground (P/G) network for transmitting the signal pattern. The channel model 14 represents the behavior of a transmission line or a wiring path between the driver model 12 and the load circuit 16, such as a memory device. For a 16-bit application, for example, there will be sixteen driver models and sixteen corresponding channel models in the system 10. In the channel model 14, resistive, inductive and capacitive components may exist. When I/O drivers turn on or operate at a same time, in particular, noise in the form of $$L \times \frac{di}{dt}$$

due to the inductive components may occur, which is likely to adversely affect signal integrity.

Unlike a transistor-based I/O driver in some existing tools, the driver model 12 is built in a current source model that operates in frequency domain. Alternatively, the driver model 12 may be built in a voltage source model that operates in frequency domain. Moreover, unlike a complex RLCK (resistance-inductance-capacitance-mutual inductance) network in the existing tools, the channel model 14 is represented by an approaching curve or an approaching line and operates in frequency domain. The driver model 12 and the channel model 14 will be discussed in detail with reference to FIGS. 3A, 3B and FIGS. 4, 5, respectively.

The drive strength of the driver model 12 is a measurement of how much current the driver model 12 launches on the load circuit 16. It can also determine the largest load that can be driven at a certain speed, without affecting the integrity of the transmitted signal. In other words, a stronger driver model is able to drive larger loads and longer transmission lines. In signal integrity analysis, it is determined whether an output signal read at the load circuit 16 fails to reach the minimum voltage level that will be interpreted as a logical "1" for the case of a low-to-high transition, or reach the maximum voltage level that will be interpreted as a logical "0" for the case of a high to low transition, if affirmative, the driver model 12 is able to drive the load circuit 16. If not, the driver model 12 causes an incorrect reading and is not able to drive the load circuit 16.

The system 10 is suitable for, but is not limited to, use in a high-speed, broad-band environment to evaluate signal integrity of a design. In some embodiments, high speed may mean a data rate of gigabits per second (Gb/s), for example, four (4) Gb/s or higher, while broad band may mean a band ranging from approximately 0 to 10 gigahertz (GHz) or larger.

In some existing tools, such as electronic design automation (EDA) tools, a transistor-based approach is employed for analysis of signal integrity. To analyze signal integrity in a broad-band design or system, the existing tools can only make one analysis at a specific frequency. Accordingly, to cover the entire broad band, the existing tools may iterate analysis at, for example, every regular GHz such as 1 GHz. Given a broad band of 0 to 10 GHz, the existing tools are required to make ten analyses at ten different frequency points. If a more precise result is needed and thus analysis is made at, for example, every 0.1 GHz, then the existing tools are required to make one hundred analyses at one hundred different frequency points. As a result, for signal integrity analysis in a broad-band design or system, the existing tools may be relatively time-consuming and complicated.

Figure 2:
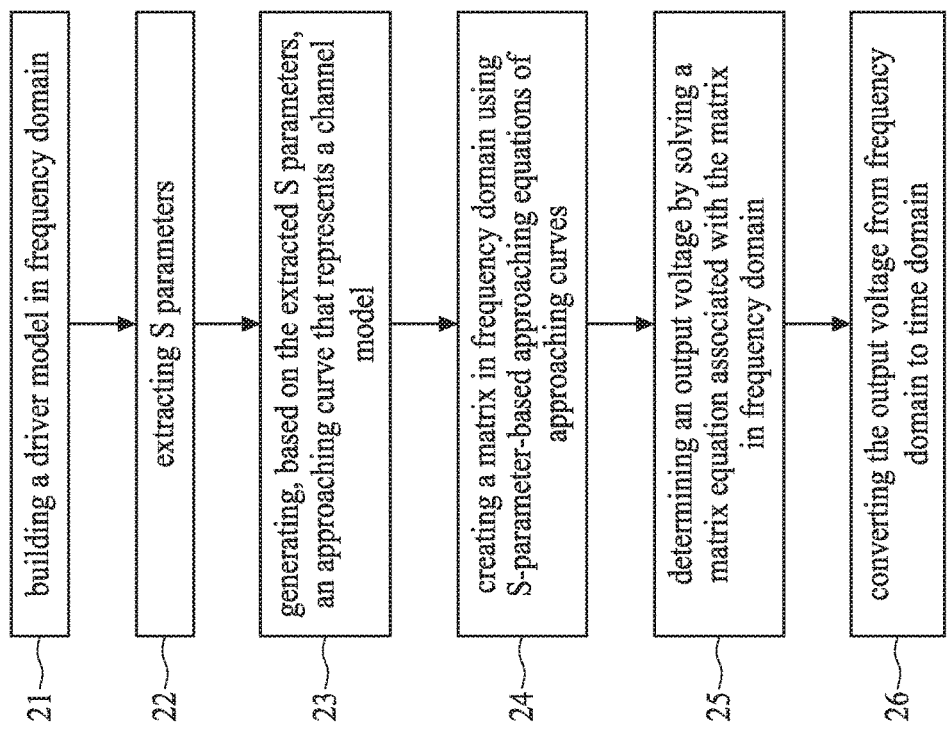
FIG. 2 is a flow diagram showing a method for analysis of signal integrity, in accordance with some embodiments.

FIG. 2 is a flow diagram showing a method for analysis of signal integrity, in accordance with some embodiments.

Figure 3A:
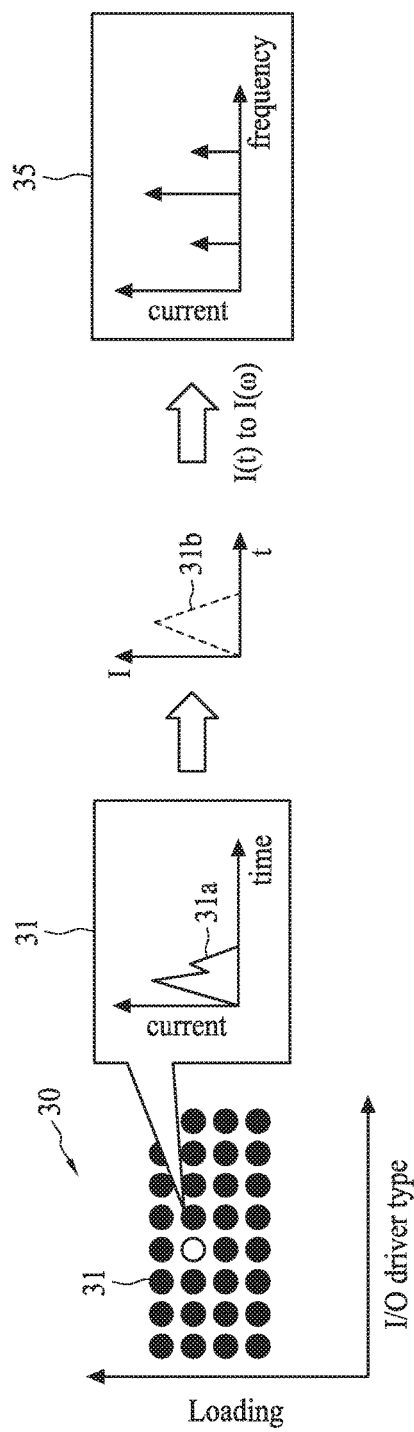
FIG. 3A is a schematic diagram showing a method of building a driver model in frequency domain, in accordance with some embodiments.

Referring to FIG. 2, in operation 21, a driver model is built in frequency domain. FIG. 3A is a schematic diagram showing a method of building a driver model in frequency domain, in accordance with some embodiments. Also referring to FIG. 3A, various I/O drivers and loadings under which these I/O drivers may operate are shown in a plot 30. In the present embodiment, one of I/O drivers is selected and an output current over time is measured at various loadings. Each of the I/O drivers that operates under a predetermined loading results in a current-time graph 31, which exhibits the current behavior of an I/O driver in time domain. Alternatively, in some embodiments, a voltage-time graph (not shown) may be determined instead of the current-time graph 31. The time-domain graph 31 may be generated with the help of an EDA tool using, for example, software program with integrated circuit emphasis (SPICE). The I/O drivers may include drivers of, for example, an inverter type, a NOR type and a NAND type. The loadings may range from, for example, approximately 1 to 10 picofarads (pf). Furthermore, in addition to loadings, delay timing and transition of the I/O drivers may also be taken into consideration in building a driver model so as to more precisely reflect the current behavior or characteristics of a driver model. Information on the I/O drivers and their loadings, delay timing or transition may be retrieved from a standard cell library, or obtained by conducting a simulation on a layout design. The time-domain driver model represented by the current-time graph 31 is then converted by, for example, the Fourier transform, into a frequency-domain driver model represented by a current-frequency graph 35. In an embodiment, to facilitate the conversion, the waveform 31a of the current in the current-time graph 31 is made approximate to a simple waveform 31b such as a triangular waveform so that higher frequency components or harmonics can be avoided.

Figure 3B:
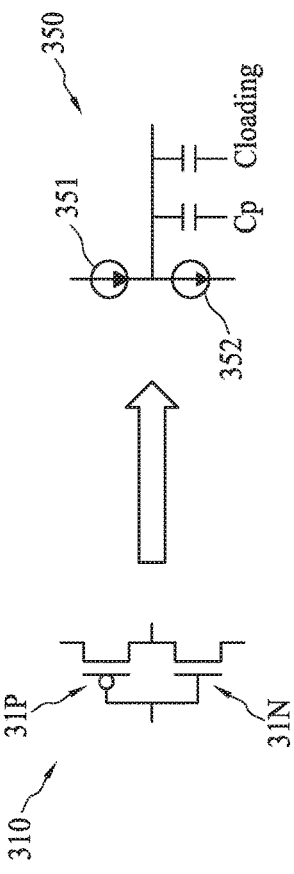
FIG. 3B is a diagram of an exemplary I/O driver in the driver model described with reference to FIG. 3A.

FIG. 3B is a diagram of an exemplary I/O driver 350 in the driver model 12 described with reference to FIG. 3A. Referring to FIG. 3B, an inverter-type I/O driver 310 may include a p-type metal-oxide-semiconductor (PMOS) transistor 31P and an n-type metal-oxide-semiconductor (NMOS) transistor 31N. After the driver model is built, the transistor-based inverter-type I/O driver 310 is transformed to a current-source-based I/O driver 350. The I/O driver 350 includes a first current source 351 that may correspond to the PMOS transistor 31P, and a second current source 352 that may correspond to the NMOS transistor 31N of the inverter-type I/O driver 310. In addition, The I/O driver 350 includes a parasitic capacitance Cp and an input capacitance Cloading as seen by the I/O driver 350.

Referring back to FIG. 2, in operation 22, S parameters (scattering parameters) are extracted. The S parameters describe a real curve that represents a real signal channel between the driver model 12 and the load circuit 16. S parameters may be measured by an EDA tool such as an S-parameter simulator, which is used to calculate channel performance in frequency domain. S parameters, defined in terms of incident and reflected travelling waves, include S11/S22 (reflection coefficient), S12 (isolation) and S21 (insertion loss). As the measurement of S parameters using network analyzers has become popular, these parameters S11, S22, S12 and S21 are only briefly discussed with reference to FIG. 4, S parameters are vector entities which are derived from vector based measurements, for example, magnitude and phase. For a two-port network such as the circuit network 40, S parameters can be denoted as Sij, where i and j equal 1 and 2. As a result, there are four S parameters, namely S11, S21, S12, and S22, in a two-port network. For a three-port network, S parameters can be denoted as Sij, where i and j equal 1, 2 and 3, and represented in a matrix form such as $$\begin{pmatrix} S11 & S12 & S13 \\ S21 & S22 & S23 \\ S31 & S32 & S33 \end{pmatrix}.$$

For simplicity, only the exemplary two-port circuit network 40 is discussed.

Figure 4:
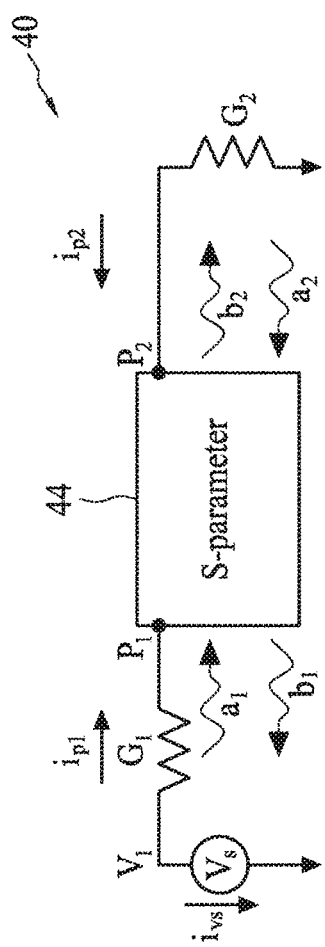
FIG. 4 is a diagram of an exemplary circuit network for extracting S parameters from the system illustrated in FIG. 1.

FIG. 4 is a diagram of an exemplary circuit network 40 for extracting S parameters from the system 10 illustrated in FIG. 1. Also referring to FIG. 4, the circuit network 40 includes a first port P1, a second port P2 and a signal channel 44 between the first port P1 and the second port P2. The first port P1 is considered an input port, and the second port P2 is considered an output port. Circuit components such as V1, Vs, ivs, ip1 and G1 at the side of the first port P1 may be derived from an I/O driver and the P/G network in the driver model 12 of the system 10. Similarly, circuit components such as ip2 and G2 may be derived from the load circuit 16 of the system 10. The circuit network 40 allows a response of the circuit network 40 to signals applied to the ports P1 and P2 to be calculated easily, without solving for all the internal voltages and currents in the circuit network 40.

In the circuit network 40, a1 and a2 are incident waves, and b1 and b2 are reflected waves. The relationship between the waves a1, a2, b1, b2 and S parameters S11, S22, S12, S21 are expressed as follows.

$$b1 = S11 \times a1 + S12 \times a2; \text{ and}$$

$$b2 = S21 \times a1 + S22 \times a2,$$

where S11 represents a voltage reflection coefficient at the first port P1, S22 represents a voltage reflection coefficient at the second port P2, S12 represents a reverse voltage gain, and S21 represent a forward voltage gain.

Figure 5:
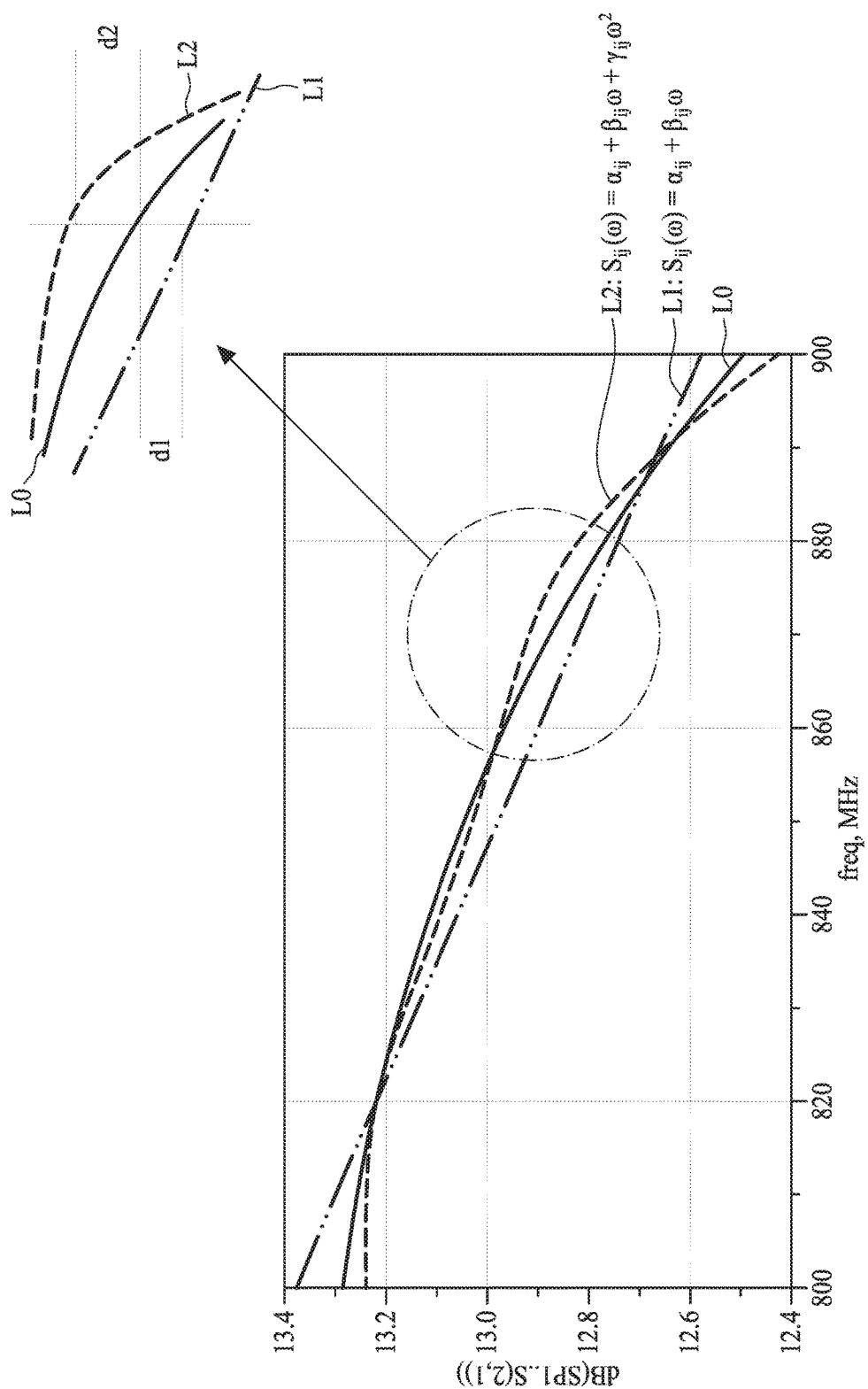
FIG. 5 is a schematic diagram showing a real curve, an approaching line and an approaching curve of an exemplary S parameter.

Referring back to FIG. 2, in operation 23, an approaching curve of each of the extracted S parameters is generated. The approaching curves or in some embodiments approaching lines represent the behavior of the channel model 14 described and illustrated with reference to FIG. 1. FIG. 5 is a schematic diagram showing a real curve L0, an approaching line L1 and an approaching curve L2 of an exemplary S parameter. For simplicity, only the S parameter S21 is discussed. Also referring to FIG. 5, the horizontal coordinate represents frequency in megahertz (MHz), while the vertical coordinate represents voltage gain in decibels (dB). The real curve L0 represents the voltage gain of the extracted parameter S21 at various frequencies. The approaching line L1 and the approaching curve L2 may be derived from the real curve L0 by curve fitting. If the real curve L0 can be approached by a linear line, the approaching line L1 is used. If the real curve L0 includes inflection points or significant turning points and thus cannot be approached by a linear line, then the approaching curve L2 is used. Accordingly, an approaching curve may be reduced to or replaced by an approaching line if a linear line can be used to describe a real curve within a predetermined threshold error. The approaching curve L2 may not be limited to a second-order curve even though a second-order curve is easier in analysis than a higher-order curve.

Exemplary equations for the approaching line L1 and the approaching curve L2 are expressed below.

$$S21(\omega)=\alpha 21+\beta 21\times\omega; \text{ and} \qquad \text{L1:}$$

$$S21(\omega)=\alpha 21+\beta 21\times\omega+\gamma 21\times\omega^2, \qquad \text{L2:}$$

where $\alpha$, $\beta$ and $\gamma$ are constants, and $\omega$ is angular frequency.

Furthermore, general equations of an approaching line L1 and an approaching curve L2 for an S parameter Sij may be expressed below.

$$Sij(\omega)=\alpha ij+\beta ij\times\omega; \text{ and} \qquad \text{L1:}$$

$$Sij(\omega)=\alpha ij+\beta ij\times\omega+\gamma ij\times\omega^2. \qquad \text{L2:}$$

As a function of the angular frequency $\omega$, these S-parameter-based approaching equations of the approaching line L1 and approaching curve L2 are called frequency-aware equations. In generating an approaching line or approaching curve, the constants $\alpha$, $\beta$ and $\gamma$ are determined so that a difference between the value $Sij(\omega)$ at a certain frequency and a value of a real curve at that frequency in a frequency spectrum is kept within a predetermined threshold error. For example, as shown in an amplified view of FIG. 5, a difference d1 between the approaching line L1 and the real curve L0 at the frequency of 870 MHz is smaller than a threshold, for example, approximately 10% from the real value. Likewise, a difference d2 between the approaching curve L2 and the real curve L0 at the frequency of 870 MHz is smaller than the threshold.

As previously discussed, in some existing tools, several tens or even few hundreds of frequency points are used in an analysis of signal integrity. With the approaching line L1 or approaching curve L2, only few frequency points are checked, which significantly reduces the burden of complex computation that would otherwise be required in the existing tools. As a result, the method according to the present disclosure using the approaching line L1 or approaching curve L2 facilitates a fast and easy evaluation of signal integrity in a design or system.

Referring back to FIG. 2, in operation 24, a matrix in frequency domain is created using S-parameter-based approaching equations of approaching curves. FIG. 6 is a diagram showing a frequency-aware matrix 60 created using S-parameter-based equations of approaching curves. Also referring to FIG. 6, the matrix 60 includes a G (conductance) matrix that satisfies a matrix equation $G(\omega)=V\times 1$ as illustrated in FIG. 6. In building the matrix equation, the Kirchhoff's Current Law (KCL) and Kirchhoff's Voltage Law (KVL) are applied to the exemplary circuit network 40 described and illustrated with reference to FIG. 4, resulting in, for example, a linear system of equations in current and voltage as follows.

$$i_{p1}=(\omega)Y_{01}\times[a_1(\omega)-b_1(\omega)]$$

$$i_{p2}(\omega)=Y_{02}\times[a_2(\omega)-b_2(\omega)]$$

$$V_{p1}(\omega)=a_1(\omega)+b_1(\omega)$$

$$V_{p2}(\omega)=a_2(\omega)+b_2(\omega)$$

$$b_1(\omega)=s_{11}a_1(\omega)+s_{12}a_2(\omega)$$

$$b_2(\omega)=s_{21}a_1(\omega)+s_{22}a_2(\omega)$$

Moreover, in the matrix 60 the S parameters that would appear in a section 68 are replaced by the S-parameter-based approaching equations of approaching curves.

Referring back to FIG. 2, in operation 25, an output voltage represented by the V matrix in FIG. 6 is determined by solving the matrix equation in frequency domain. FIG. 7 is a diagram showing separation of the G matrix in FIG. 6 in different powers of angular frequency. Also referring to FIG. 7, the G matrix is separated into a constant term matrix G0, a first-order matrix G1 and a second-order matrix G2. That is, $G(\omega)=G_0+G_1\times\omega+G_2\times\omega^2$. Accordingly, the matrix equation, G=VI, is rewritten in equation (1) below.

$$(G_0+G_1\times\omega+G_2\times\omega^2)V=I \qquad \text{equation(1)}$$

To solve the matrix V, V is then expressed in equation (2) as follows.

$$V=(G_0+G_1\times\omega+G_2\times\omega^2)^{-1}I=(1+G_1G_0^{-1}\times\omega+G_2G_0^{-1}\times\omega^2)^{-1}G_0^{-1}I \qquad \text{equation (2)}$$

Let A represents $-G_1G_0^{-1}$ and B represents $-G_2G_0^{-1}$, V is written as:

$$V=(1-A\omega-B\omega^2)^{-1}G_0^{-1}I \qquad \text{equation (3)}$$

By a Taylor series expansion, V in the above equation (3) is expressed in equation (4) below.

$$V=[1+A\omega+(A^2+B^2)\omega^2+(2AB+A^3)\omega^3+(A^4+3A^2B+B^2)\omega^4+\ldots)G_0^{-1}I \qquad \text{equation (4)}$$

Referring back to FIG. 2, in operation 26, the output voltage V is converted from frequency domain to time domain by, for example, the inverse Fourier transform. Subsequently, it is determined whether the output voltage V in time domain reaches a desired value. If not, signal integrity is adversely affected. Signal-integrity problems, including delays, ringing, crosstalk, and electromagnetic interference (EMI), can be identified through the method described and illustrated in FIG. 2. Once potential problems have been identified, a design layout can be constrained to improve performance, and termination strategies can be applied to minimize the impact of signal integrity on the overall performance of a high-speed design. By addressing signal-integrity problems early, a high-performance product can be produced with higher reliability and lower cost.

Figure 8:
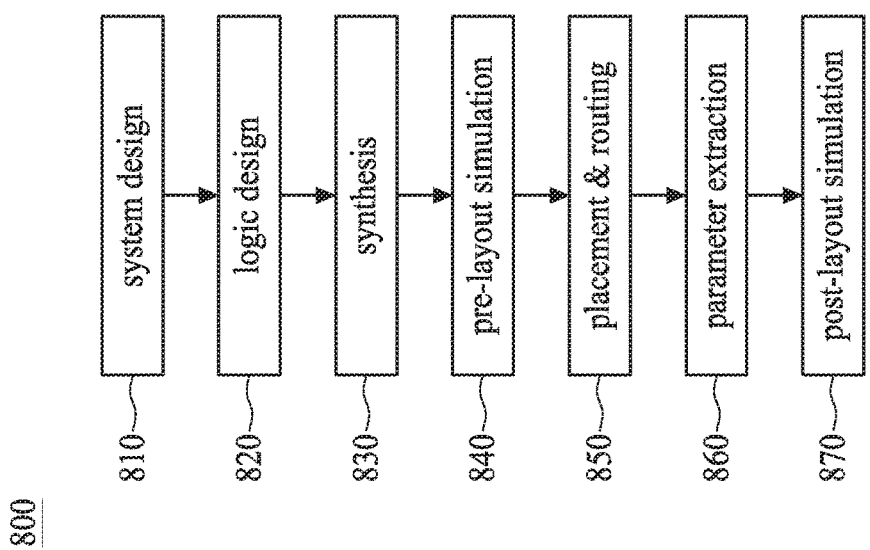
FIG. 8 is a schematic diagram illustrating a design flow in accordance with some embodiments.

FIG. 8 is a schematic diagram illustrating a design flow 800 in accordance with some embodiments. The design flow 800 facilitates fabrication of an IC. In the process of fabricating an IC, the method according to the present disclosure provides a fast and easy way of evaluation for analysis of signal integrity in a broadband system. The analysis is conducted in frequency domain. A result of the analysis, for example, an output voltage, is converted from frequency to time domain and may then be checked to determine whether it reaches a desired value. If not, the process will return to an earlier stage, for example, a placement and routing stage or even a logic design or system design stage, for an improvement or enhancement in design. An exemplary design flow 800 is thus introduced by referring to FIG. 8 as follows.

Referring to FIG. 8, the design flow 800, employed for designing semiconductor chips, utilizes one or more electronic design automation (EDA) tools to facilitate design operations. A workstation or personal computer is used in executing the tools to accomplish the design flow 800. The design flow 800 comprises a system design stage 810, a logic design stage 820, a synthesis stage 830, a pre-layout simulation stage 840, a placement and routing stage 850, a parameter extraction stage 860 and a post-layout simulation stage 870.

Initially, at the system design stage 810, a systematic architecture for the chip of interest is provided with a high level description. In that stage, each function of the chip along with performance requirements is determined according to a design specification. Those functions are usually represented by respective schematic functional modules or blocks. In addition, an optimization or performance trade-off may be sought in order to achieve the design specification with affordable cost and power.

At the logic design stage 820, the functional modules or blocks are described in a register transfer level (RTL) using a hardware description language. The language tools are usually available from commercial software, for example, Verilog or VHDL. A preliminary functionality check is performed at the logic design stage 820 to verify if the implemented functions conform to the specification set forth in the system design stage 810.

Subsequently, at the synthesis stage 830, the modules in RTL descriptions are converted into a netlist data where circuit structure, for example, logic gates and registers, in each function module are established. Mapping of such logic gates and registers to available cells in a standard cell library may be conducted. Further, the netlist data is offered to describe the functional relationship of the chip devices in a gate-level. The netlist data is transformed from the gate-level view to a transistor-level view. The term "netlist" used herein refers to both graphical-based representation such as a schematic and/or a text-based representation of a circuit.

Then, the gate-level netlist data is verified at the pre-layout simulation stage 840. At the verification process of the stage 840, if some of the functions fail the verification in the simulation, the design flow 800 may be paused temporarily and go back to the stages 810 or 820 for further correction or modification. After the pre-layout simulation stage 840, the IC chip design has passed a preliminary verification and completed the front-end design process. Subsequently, a back-end physical design process will follow.

At the placement and routing stage 850, a physical architecture representing the circuits determined during the front-end process is implemented. The detailed structure and associated geometry of each component and device are determined in the placement operation, and interconnects among different components are routed subsequent to the placement operation. Moreover, the placement operation involves deciding where to place each IC chip component and circuitry in a limited amount of space, and the routing operation decides the actual wiring of connecting lines. Both operations of placement and routing are performed to meet a design rule check (DRC) deck, such as from the chip manufacturing facility, so as to fulfill the manufacturing criteria of the chip. After the placement and routing stage 850, a placed-and-routed layout data is created and a netlist with placement and routing data is generated accordingly.

At the parameter extraction stage 860, a layout parameter extraction (LPE) operation is conducted to derive layout-dependent parameters, such as parasitic resistance and capacitance, resulting from a developed layout at the stage 850. In some embodiments, before the layout parameter extraction operation, a layout-versus-schematic (LVS) verification is performed to check the functional performance of the chip in terms of the placed-and-routed netlist. Consequently, a post-layout netlist data is then generated, which includes the layout-dependent parameters.

At the post-layout simulation stage 870, a physical verification is performed by taking the parameters acquired in previous stages into account. At the stage 870, a simulation of transistor-level behavior is conducted in order to examine whether the chip performs the desired functionality within the required system specification. Moreover, the post-layout simulation is performed to ensure no presence of electrical issues or lithographic issues in the chip manufacturing process.

After the post-layout simulation stage 870, it is determined whether the post-layout netlist fulfills the design specification. If affirmative, the circuit design is accepted and then signed off accordingly. However, if the result of the post-layout simulation is unfavorable, the design flow 800 would loop back to previous stages for functionality or performance tuning. For example, the design flow 800 may loop back to the placement and routing stage 850 where the layout is re-developed so as to fix issues from the layout level. Alternatively, the design flow 800 may retreat to earlier stages; either the system design stage 810 or the logic design stage 820 in order to recast the chip design in case the problems cannot be resolved in the back-end stage.

The design flow 800 illustrated in FIG. 8 is exemplary. The method and system for analysis of signal integrity are applicable to the design flow 800 or other design flows including other sequences of the stages or operations, partition of the stages, or additional stages before, between or after the stages shown.

FIG. 9 is a block diagram of a system 900 for timing optimization, in accordance with some embodiments.

Referring to FIG. 9, the system 900 includes a processor 901, a network interface 903, an input and output (I/O) device 905, a storage device 907, a memory 909, and a bus or network 908. The bus 108 couples the network interface 903, the I/O device 905, the storage device 907 and the memory 909 to the processor 901.

The processor 901 is configured to execute program instructions that include a tool configured to perform a method as described and illustrated with reference to FIG. 2. Accordingly, the tool is configured to execute the operations including building a driver model in frequency domain, extracting S parameters, generating, based on the extracted S parameters, an approaching curve that represents a channel model, creating a matrix in frequency domain using S-parameter-based approaching equations of approaching curves, determining an output voltage by solving a matrix equation associated with the matrix in frequency domain, and converting the output voltage from frequency domain to time domain.

The network interface 903 is configured to access program instructions and data accessed by the program instructions stored remotely through a network (not shown).

The I/O device 905 includes an input device and an output device configured for enabling user interaction with the system 900. In some embodiments, the input device comprises, for example, a keyboard, a mouse, and other devices. Moreover, the output device comprises, for example, a display, a printer, and other devices.

The storage device 907 is configured for storing program instructions and data accessed by the program instructions. In some embodiments, the storage device 907 comprises, for example, a magnetic disk and an optical disk.

The memory 909 is configured to store program instructions to be executed by the processor 901 and data accessed by the program instructions. In some embodiments, the memory 909 comprises a random access memory (RAM) and/or some other volatile storage device and/or read only memory (ROM) and/or some other non-volatile storage device.

In some embodiments, the present disclosure provides a method of building a driver model in frequency domain, extracting S (scattering) parameters, the S parameters to describe a real curve that represents a real signal channel between the driver model and a load circuit, and generating, based on the extracted S parameters, an approaching curve of the real curve, the approaching curve being expressed in an approaching equation.

In some embodiments, the present disclosure also provides a system for analysis of signal integrity. The system includes a driver model that represents the behavior of an input/output (I/O) driver for sending a signal pattern towards a load circuit, and a channel model, between the driver model and the load circuit, represented by an approaching curve based on S (scattering) parameters of a real curve that represents a real signal channel between the driver model and the load circuit.

In some embodiments, the present disclosure provides a system that includes one or more processors and one or more programs including instructions. The instructions, when executed by the one or more processors, cause the system to build a driver model in frequency domain, extract S (scattering) parameters, the S parameters to describe a real curve that represents a real signal channel between the driver model and a load circuit, and generate, based on the extracted S parameters, an approaching curve of the real curve, the approaching curve being expressed in an approaching equation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, comprising:
   building a driver model in frequency domain, the driver model representing a behavior of a driver circuit of the integrated circuit;
   extracting S (scattering) parameters, the S parameters to describe a real curve that represents a real signal channel between the driver model and a load circuit;
   generating, based on the extracted S parameters, an approaching curve of the real curve, the approaching curve being an approximation to the real curve and expressed in an approaching equation, wherein a difference between the approaching curve and the real curve at a given frequency in a frequency spectrum is smaller than a predetermined threshold error;
   analyzing signal integrity for the integrated circuit according to the approaching curve, and accordingly generating an analysis result; and
   fabricating the integrated circuit comprising the driver circuit according to the analysis result.

2. The method according to claim 1, wherein analyzing signal integrity for the integrated circuit according to the approaching curve comprises:
   creating a matrix in frequency domain using approaching equations of approaching curves; and
   analyzing the signal integrity for the integrated circuit according to the matrix.

3. The method according to claim 2, wherein analyzing the signal integrity for the integrated circuit according to the matrix comprises:
   determining an output by solving a matrix equation associated with the matrix in frequency domain;
   converting the output from frequency domain to time domain; and
   generating the analysis result according to the output converted to time domain.

4. The method according to claim 3, wherein generating the analysis result according to the output converted to time domain comprises:
   determining whether the output reaches a predetermined signal level to generate the analysis result.

5. The method according to claim 1, wherein analyzing signal integrity for the integrated circuit according to the approaching curve comprises:
   determining if an approaching line is able to describe the real curve within the predetermined threshold error; and
   replacing the approaching curve with the approaching line if such approaching line exists.

6. The method according to claim 1, wherein the driver circuit comprises input/output (I/O) drivers; building the driver model in frequency domain further comprises:
   determining one of the input/output (I/O) drivers; and
   measuring an output current of the one I/O driver at various loadings in time domain.

7. The method according to claim 6, wherein building the driver model in frequency domain further comprises:
   determining a waveform approximate to that of the output current; and
   converting the approximate waveform from time domain to frequency domain.

8. The method according to claim 1, wherein building the driver model in frequency domain further comprises:
   determining a transistor-based input/output (I/O) driver in time domain; and
   converting the transistor-based I/O driver to a current-source-based driver in frequency domain.

9. A system for analysis of signal integrity for an integrated circuit, the system comprising:
   a driver model that represents the behavior of an input/output (I/O) driver for sending a signal pattern towards a load circuit; and a channel model, between the driver model and the load circuit, represented by an approaching curve based on S (scattering) parameters of a real curve that represents a real signal channel between the driver model and the load circuit, the approaching curve being an approximation to the real curve, wherein a difference between the approaching curve and the real curve at a given frequency in a frequency spectrum is smaller than a predetermined threshold error and an analyzer, configured to generate an analysis result by analyzing the signal integrity according to the approaching curve, and refer to the analysis result to fabricate the integrated circuit.

10. The system according to claim 9, wherein the analyzer is configured to determine whether an output signal read at the load circuit reaches a predetermined signal level to generate the analysis result.

11. The system according to claim 10, wherein the approaching curve is replaced with an approaching line if the approaching line satisfies the predetermined threshold error.

12. The system according to claim 9, wherein the I/O driver includes one of an inverter, a NOR or a NAND.

13. A system for fabricating an integrated circuit, the system comprising one or more processors and one or more programs including instructions which, when executed by the one or more processors, cause the system to:

build a driver model in frequency domain, the driver model representing a behavior of a driver circuit of the integrated circuit;

extract S (scattering) parameters, the S parameters to describe a real curve that represents a real signal channel between the driver model and a load circuit;

generate, based on the extracted S parameters, an approaching curve of the real curve, the approaching curve being an approximation to the real curve and expressed in an approaching equation, wherein a difference between the approaching curve and the real curve at a given frequency in a frequency spectrum is smaller than a predetermined threshold error;

analyze signal integrity for the integrated circuit according to the approaching curve, and accordingly generate an analysis result; and fabricate the integrated circuit comprising the driver circuit according to the analysis result.

14. The system according to claim 13, wherein to analyze the signal integrity for the integrated circuit according to the approaching curve comprises instructions which, when executed by the one or more processors, cause the system to:

create a matrix in frequency domain using approaching equations of approaching curves; and analyze the signal integrity for the integrated circuit according to the matrix.

15. The system according to claim 14, wherein to analyze the signal integrity for the integrated circuit according to the matrix comprises instructions which, when executed by the one or more processors, cause the system to:

determine an output by solving a matrix equation associated with the matrix in frequency domain;

convert the output from frequency domain to time domain; and generate the analysis result according to the output converted to time domain.

16. The system according to claim 15, wherein to generate the analysis result according to the output converted to time domain comprises instructions which, when executed by the one or more processors, cause the system to:

determine whether the output reaches a predetermined signal level to generate the analysis result.

17. The system according to claim 13, wherein to analyze the signal integrity for the integrated circuit according to the approaching curve comprises instructions which, when executed by the one or more processors, cause the system to:

determine if an approaching line is able to describe the real curve within the predetermined threshold error; and replace the approaching curve with the approaching line if such approaching line exists.

18. The system according to claim 13, wherein the driver circuit comprises input/output (I/O) drivers; to build the driver model in frequency domain further comprises instructions which, when executed by the one or more processors, cause the system to:

determine one of the input/output (I/O) drivers; and measure an output current of the one I/O driver at various loadings in time domain.

19. The system according to claim 18, wherein to build the driver model in frequency domain further comprises instructions which, when executed by the one or more processors, cause the system to:

determine a waveform approximate to that of the output current; and convert the approximate waveform from time domain to frequency domain.

20. The system according to claim 13, wherein to build the driver model in frequency domain further comprises instructions which, when executed by the one or more processors, cause the system to:

determine a transistor-based input/output (I/O) driver in time domain; and convert the transistor-based I/O driver to a current-source-based driver in frequency domain.

* * * * *